United States Patent
Fujiwara et al.

(10) Patent No.: US 9,693,490 B2
(45) Date of Patent: Jun. 27, 2017

(54) REFRIGERATION DEVICE

(71) Applicant: DAIKIN INDUSTRIES, LTD., Osaka-shi, Osaka (JP)

(72) Inventors: Masahide Fujiwara, Sakai (JP); Shinichi Ishizeki, Sakai (JP); Motonobu Ikeda, Sakai (JP)

(73) Assignee: Daikin Industries, Ltd., Osaka (JP)

( * ) Notice: Subject to any disclaimer, the term of this patent is extended or adjusted under 35 U.S.C. 154(b) by 0 days.

(21) Appl. No.: 15/105,446

(22) PCT Filed: Dec. 16, 2014

(86) PCT No.: PCT/JP2014/083229
§ 371 (c)(1),
(2) Date: Jun. 16, 2016

(87) PCT Pub. No.: WO2015/098617
PCT Pub. Date: Jul. 2, 2015

(65) Prior Publication Data
US 2016/0330876 A1    Nov. 10, 2016

(30) Foreign Application Priority Data
Dec. 24, 2013 (JP) ................................ 2013-265680

(51) Int. Cl.
*F25D 23/12* (2006.01)
*H05K 7/20* (2006.01)
(Continued)

(52) U.S. Cl.
CPC ........... *H05K 7/20936* (2013.01); *F24F 1/24* (2013.01); *F25B 31/006* (2013.01); *H02M 1/42* (2013.01);
(Continued)

(58) Field of Classification Search
None
See application file for complete search history.

(56) References Cited

U.S. PATENT DOCUMENTS 7,643,296 B2    1/2010    Yamada et al.
2012/0312046 A1    12/2012    Kim et al.
(Continued)

FOREIGN PATENT DOCUMENTS

EP    1 921 737 A2    5/2008
JP    6-123449 A    5/1994
(Continued)

OTHER PUBLICATIONS

International Search Report of corresponding PCT Application No. PCT/JP2014/083229 dated Mar. 17, 2015.
International Preliminary Report of corresponding PCT Application No. PCT/JP2014/083229 dated Jul. 7, 2016.

*Primary Examiner* — Elizabeth Martin
(74) *Attorney, Agent, or Firm* — Global IP Counselors, LLP

(57) ABSTRACT

A refrigeration device includes a high-voltage electrical parts group having reactors and cooled elements, a low-voltage electrical parts group, a printed wiring board with the electrical parts groups mounted, and a refrigerant jacket that uses refrigerant flowing through the refrigerant circuit to cool the cooled elements. The high-voltage electrical parts group form an interleaved power supply circuit. The cooled elements are placed in an order conforming to a power supply path of the power supply circuit. The power supply circuit has a rectifier circuit, a power factor improvement circuit, smoothing capacitors, and an inverter circuit. The power factor improvement circuit has the reactors connected to each other in parallel and diodes and switching elements serving as the cooled elements connected to each of the reactors. The reactors are placed on an opposite side of the smoothing capacitors, with the diodes and the switching elements sandwiched in between.

2 Claims, 7 Drawing Sheets

(51) Int. Cl.
F24F 1/24 (2011.01)
F25B 31/00 (2006.01)
H02M 1/42 (2007.01)
H02P 27/06 (2006.01)
F25B 13/00 (2006.01)

(52) U.S. Cl.
CPC .............. *H02P 27/06* (2013.01); *F25B 13/00* (2013.01); *F25B 2313/0254* (2013.01); *F25B 2400/077* (2013.01)

(56) References Cited

U.S. PATENT DOCUMENTS

| | | |
|---|---|---|
| 2013/0015786 A1 | 1/2013 | Sakae et al. |
| 2013/0255932 A1 | 10/2013 | Doepker et al. |
| 2015/0114021 A1 | 4/2015 | Oguri et al. |
| 2015/0128631 A1* | 5/2015 | Oguri ........................ F24F 1/22 62/259.2 |

FOREIGN PATENT DOCUMENTS

| | | |
|---|---|---|
| JP | 2001-275360 A | 10/2001 |
| JP | 2011-78309 A | 4/2011 |
| JP | 2011-229364 A | 11/2011 |
| JP | 2013-224785 A | 10/2013 |
| JP | 5842905 B2 | 11/2015 |
| WO | 2013157218 A1 | 10/2013 |

* cited by examiner

REFRIGERATION DEVICE

CROSS-REFERENCE TO RELATED APPLICATIONS

This U.S. National stage application claims priority under 35 U.S.C. §119(a) to Japanese Patent Application No. 2013-265680, filed in Japan on Dec. 24, 2013, the entire contents of which are hereby incorporated herein by reference.

TECHNICAL FIELD

The present invention relates to a refrigeration device, and particularly a refrigeration device equipped with a refrigerant jacket that uses refrigerant flowing through a refrigerant circuit to cool cooled elements.

BACKGROUND ART

Conventionally, there has been a refrigeration device which, like the one described in JP-A No. 2013-224785, is equipped with a refrigerant jacket that uses refrigerant flowing through a refrigerant circuit to cool cooled elements. In this refrigeration device, a high-voltage electrical parts group and a low-voltage electrical parts group are mounted on a main surface of a printed wiring board, and the refrigerant jacket is placed in such away that it can cool the cooled elements of the high-voltage electrical parts group. Furthermore, from the standpoint of simplifying the wiring pattern, a reactor is connected via a harness rather than being mounted on the main surface of the printed wiring board.

SUMMARY

However, in a configuration that uses a refrigerant jacket to cooled elements, it is easy for the wiring pattern to become complicated because the cooled elements are placed concentrated in the position of the refrigerant jacket. Moreover, in the case of employing a configuration where a reactor is connected via a harness like in the conventional refrigeration device described above, not only are the cooled elements placed concentrated in the position of the refrigerant jacket, but the associated harness is also near, so there is the concern that the harness will contact other wires, resulting in an increase in interference noise.

Particularly in the case of employing an interleaved power supply circuit for power factor improvement, the number of reactors, diodes, and switching elements for configuring the power factor improvement circuit increases, so there is the concern that the wiring pattern will become even more complicated.

It is a problem of the present invention to keep the wiring pattern on a printed wiring board from becoming complicated and reduce interference noise in a refrigeration device equipped with a refrigerant jacket that uses refrigerant flowing through a refrigerant circuit to cool cooled elements.

A refrigeration device pertaining to a first aspect is a refrigeration device having a refrigerant circuit, the refrigeration device comprising: a high-voltage electrical parts group including a reactor and cooled elements that require cooling; a low-voltage electrical parts group; a printed wiring board; and a refrigerant jacket that uses refrigerant flowing through the refrigerant circuit to cool the cooled elements. Additionally, here, the high-voltage electrical parts group including the reactor and the low-voltage electrical parts group are mounted on one main surface of the printed wiring board.

Here, as described above, in contrast to the conventional configuration that uses a refrigerant jacket to cool the cooled elements, the reactor is mounted together with the other high-voltage electrical parts on the one main surface of the printed wiring board. For this reason, the harness for connecting the reactor can be eliminated.

Because of this, here, the wiring pattern on the printed wiring board can be kept from becoming complicated and interference noise can be reduced. Additionally, this also contributes to a reduction in the size and a decrease in the cost of the printed wiring board, and a high-performance placement of parts on the printed wiring board can be realized.

A refrigeration device pertaining to a second aspect is the refrigeration device pertaining to the first aspect, wherein the high-voltage electrical parts group configures an interleaved power supply circuit, and the cooled elements configuring the power supply circuit are placed in an order conforming to a power supply path of the power supply circuit.

The interleaved power supply circuit mainly has a rectifier circuit, a power factor improvement circuit, and an inverter circuit, and these circuits are connected in the order of the power supply path, which is the rectifier circuit, the power factor improvement circuit, and the inverter circuit. Included in these circuits are the cooled elements, such as diodes and switching elements.

Additionally, here, as described above, the cooled elements included in these circuits are placed in an order conforming to the power supply path, that is, in the order of the rectifier circuit, the cooled elements configuring the power factor improvement circuit, and the inverter circuit.

Because of this, here, the wiring pattern on the printed wiring board can be kept from becoming complicated even in the case of employing the interleaved power supply circuit in which the number of parts is large. Additionally, this also contributes to a reduction in the size of the printed wiring board.

A refrigeration device pertaining to a third aspect is the refrigeration device pertaining to the second aspect, wherein there are a plurality of the reactors, and the power supply circuit has a rectifier circuit, a power factor improvement circuit, smoothing capacitors, and an inverter circuit. The power factor improvement circuit has the plurality of reactors connected to each other in parallel and diodes and switching elements serving as the cooled elements connected to each of the reactors. Additionally, here, the reactors are placed on the opposite side of the smoothing capacitors, with the diodes and the switching elements configuring the power factor improvement circuit being sandwiched in between.

A refrigeration device pertaining to a fourth aspect is the refrigeration device pertaining to the third aspect, wherein the reactors are placed in the neighborhood of the diodes and the switching elements configuring the power factor improvement circuit.

In the interleaved power supply circuit, the smoothing capacitors are connected between the power factor improvement circuit and the inverter circuit, and the power factor improvement circuit has a configuration where the diodes and the switching elements are connected to each of the plural reactors. These parts including the smoothing capacitors are connected in the order of the power supply path, which is the reactors, the diodes and the switching elements, and the smoothing capacitors.

Additionally, here, as described above, the reactors are placed on the opposite side of the smoothing capacitors, with the diodes and the switching elements being sandwiched in between. That is, the reactors configuring the power factor improvement circuit, the diodes and the switching elements configuring the power factor improvement circuit, and the smoothing capacitors are placed in the order of the power supply path.

Furthermore, here, as described above, in addition to the reactors being placed on the opposite side of the smoothing capacitors, with the diodes and the switching elements being sandwiched in between, the reactors are placed in the neighborhood of the diodes and the switching elements configuring the power factor improvement circuit.

Because of this, here, the wiring pattern on the printed wiring board can be further kept from becoming complicated in the case of employing the interleaved power supply circuit in which the number of parts is large, Additionally, this also contributes to a further reduction in the size of the printed wiring board.

DESCRIPTION OF EMBODIMENT

An embodiment of an air conditioning device serving as a refrigeration device pertaining to the present invention, and example modifications thereof, will be described below on the basis of the drawings. It should be noted that the specific configurations of the refrigeration device pertaining to the present invention are not limited to those in the following embodiment and example modifications thereof, and can be changed to the extent that they do not depart from the spirit of the invention.

(1) Configuration of Refrigeration Device

Figure 1:
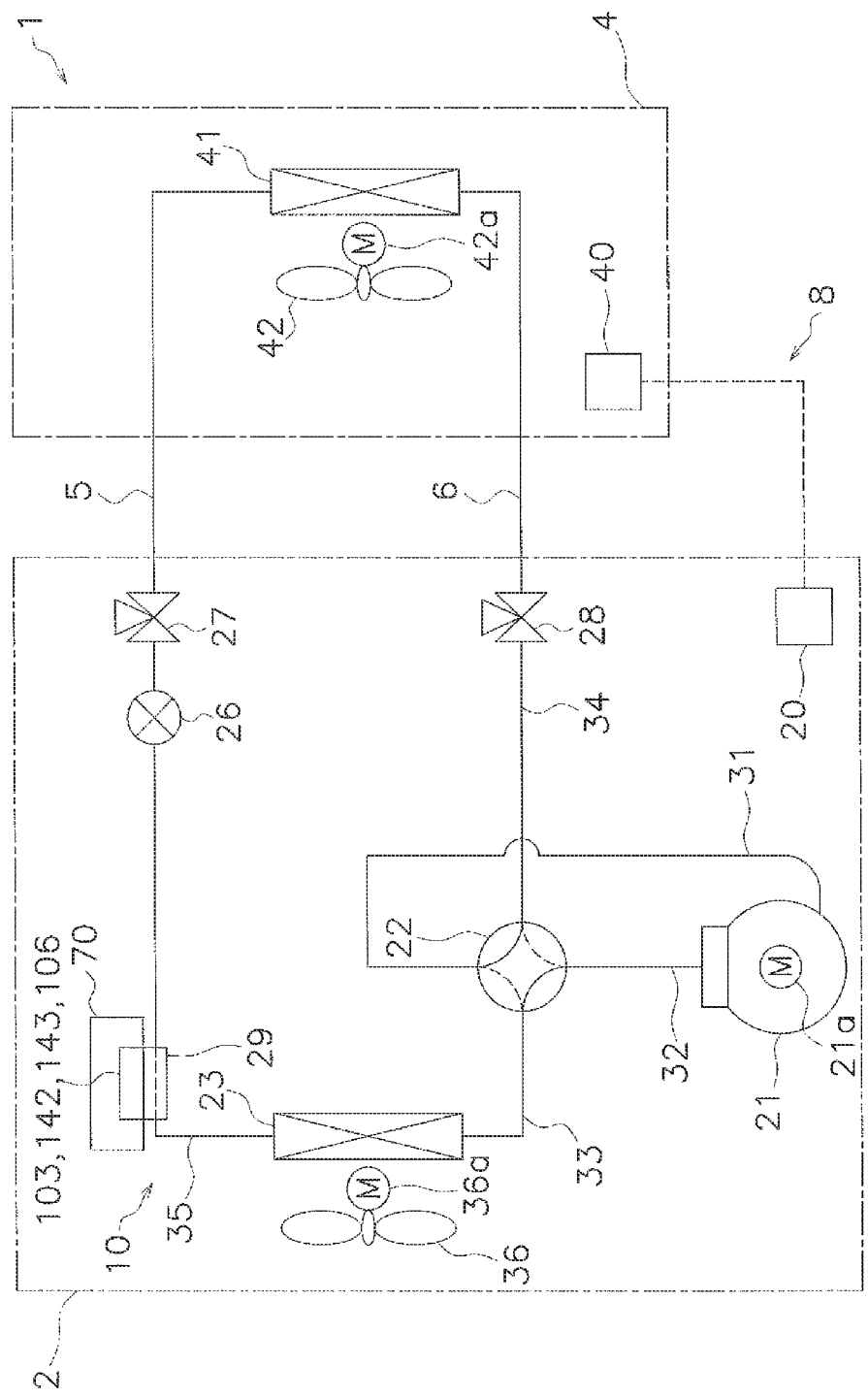
FIG. 1 is a schematic configuration diagram of an air conditioning device serving as an embodiment of a refrigeration device pertaining to the present invention.

FIG. 1 is a schematic configuration diagram of an air conditioning device 1 serving as an embodiment of the refrigeration device pertaining to the present invention.

The air conditioning device 1 is a device that can cool and heat a room in a building, for example, by performing a vapor compression refrigeration cycle. The air conditioning device 1 is configured as a result of mainly an outdoor unit 2 and an indoor unit 4 being connected to each other. Here, the outdoor unit 2 and the indoor unit 4 are connected to each other via a liquid refrigerant connection pipe 5 and a gas refrigerant connection pipe 6. That is, a vapor compression refrigerant circuit 10 of the air conditioning device 1 is configured as a result of the outdoor unit 2 and the indoor unit 4 being connected to each other via the refrigerant connection pipes 5 and 6.

<Indoor Unit>

The indoor unit 4 is installed in the room and configures part of the refrigerant circuit 10. The indoor unit 4 mainly has an indoor heat exchanger 41.

The indoor heat exchanger 41 is a heat exchanger which, during the cooling operation, functions as an evaporator of the refrigerant to cool the room air and which, during the heating operation, functions as a radiator of the refrigerant to heat the room air. The liquid side of the indoor heat exchanger 41 is connected to the liquid refrigerant connection pipe 5, and the gas side of the indoor heat exchanger 41 is connected to the gas refrigerant connection pipe 6.

The indoor unit 4 has an indoor fan 42 for sucking the room air into the indoor unit 4, allowing the room air to exchange heat with refrigerant in the indoor heat exchanger 41, and thereafter supplying the air to the room as supply air. That is, the indoor unit 4 has the indoor fan 42 as a fan that supplies to the indoor heat exchanger 41 the room air which serves as a heating source or a cooling source for the refrigerant flowing through the indoor heat exchanger 41. Here, for example, a centrifugal fan or a multi-blade fan driven by an indoor fan motor 42a is used as the indoor fan 42.

The indoor unit 4 has an indoor-side controller 40 that controls the actions of the parts configuring the indoor unit 4. Additionally, the indoor-side controller 40 has a microcomputer and a memory disposed in order to control the indoor unit 4, and can exchange control signals and so forth with a remote controller (not shown in the drawings) and exchange control signals and so forth with the outdoor unit 2.

<Outdoor Unit>

The outdoor unit 2 is installed outdoors and configures part of the refrigerant circuit 10. The outdoor unit 2 mainly has a compressor 21, a four-way switching valve 22, an outdoor heat exchanger 23, a refrigerant jacket 29, an expansion valve 26, a liquid-side stop valve 27, and a gas-side stop valve 28.

The compressor 21 is a device that compresses the refrigerant having a low pressure in the refrigeration cycle to a high pressure. The compressor 21 has a closed structure where a rotary type or scroll type positive-displacement compression element (not shown in the drawings) is driven to rotate by a compressor motor 21a supplied with power through a later-described power supply circuit 100. The compressor 21 has a suction pipe 31 connected to its suction side and a discharge pipe 32 connected to its discharge side. The suction pipe 31 is a refrigerant pipe that interconnects the suction side of the compressor 21 and the four-way switching valve 22. The discharge pipe 32 is a refrigerant pipe that interconnects the discharge side of the compressor 21 and the four-way switching valve 22.

The four-way switching valve 22 is a switching valve for switching the direction of the flow of the refrigerant in the refrigerant circuit 10. During the cooling operation, the four-way switching valve 22 switches to a cooling cycle state in which it causes the outdoor heat exchanger 23 to function as a radiator of the refrigerant compressed in the compressor 21 and causes the indoor heat exchanger 41 to function as an evaporator of the refrigerant that has radiated heat in the outdoor heat exchanger 23. That is, during the cooling operation, the four-way switching valve 22 interconnects the discharge side of the compressor 21 (here, the discharge pipe 32) and the gas side of the outdoor heat exchanger 23 (here, a first gas refrigerant pipe 33) (see the solid lines of the four-way switching valve 22 in FIG. 1). Moreover, the four-way switching valve 22 interconnects the suction side of the compressor 21 (here, the suction pipe 31) and the gas refrigerant connection pipe 6 (here, a second gas refrigerant pipe 34) (see the solid lines of the four-way switching valve 22 in FIG. 1). Furthermore, during the heating operation, the four-way switching valve 22 switches to a heating cycle state in which it causes the outdoor heat exchanger 23 to function as an evaporator of the refrigerant that has radiated heat in the indoor heat exchanger 41 and causes the indoor heat exchanger 41 to function as a radiator of the refrigerant compressed in the compressor 21. That is, during the heating operation, the four-way switching valve 22 interconnects the discharge side of the compressor 21 (here, the discharge pipe 32) and the gas refrigerant connection pipe 6 (here, the second gas refrigerant pipe 34) (see the dashed lines of the four-way switching valve 22 in FIG. 1). Moreover, the four-way switching valve 22 interconnects the suction side of the compressor 21 (here, the suction pipe 31) and the gas side of the outdoor heat exchanger 23 (here, the first gas refrigerant pipe 33) (see the dashed lines of the four-way switching valve 22 in FIG. 1). Here, the first gas refrigerant pipe 33 is a refrigerant pipe that interconnects the four-way switching valve 22 and the gas side of the outdoor heat exchanger 23. The second gas refrigerant pipe 34 is a refrigerant pipe that interconnects the four-way switching valve 22 and the gas-side stop valve 28.

The outdoor heat exchanger 23 is a heat exchanger which, during the cooling operation, functions as a radiator of the refrigerant using the outdoor air as a cooling source and which, during the heating operation, functions as an evaporator of the refrigerant using the outdoor air as a heating source. The liquid side of the outdoor heat exchanger 23 is connected to a liquid refrigerant pipe 35, and the gas side of the outdoor heat exchanger 23 is connected to the first gas refrigerant pipe 33. The liquid refrigerant pipe 35 is a refrigerant pipe that interconnects the liquid side of the outdoor heat exchanger 23 and the liquid refrigerant connection pipe 5.

The expansion valve 26 is a valve which, during the cooling operation, reduces to a low pressure in the refrigeration cycle the pressure of the refrigerant having a high pressure in the refrigeration cycle that has radiated heat in the outdoor heat exchanger 23. Furthermore, the expansion valve 26 is a valve which, during the heating operation, reduces to a low pressure in the refrigeration cycle the pressure of the refrigerant having a high pressure in the refrigeration cycle that has radiated heat in the indoor heat exchanger 41. The expansion valve 26 is disposed in a section of the liquid refrigerant pipe 35 near the liquid-side stop valve 27. Here, an electrically powered expansion valve is used as the expansion valve 26.

The refrigerant jacket 29 is a heat exchanger that uses the refrigerant circulating through the refrigerant circuit 10 (here, the refrigerant flowing through the refrigerant pipe 35) to cool cooled elements 103, 142a to 142c, 143a to 143c, and 106 that emit a lot of heat and require cooling among electrical components configuring a later-described electrical component unit 70. That is, during the cooling operation, the refrigerant jacket 29 functions as a heat exchanger that cools the cooled elements 103, 142a to 142c, 143a to 143c, and 106 using the refrigerant having a high pressure in the refrigeration cycle that has radiated heat in the outdoor heat exchanger 23 (that is, the refrigerant flowing between the outdoor heat exchanger 23 and the expansion valve 26), and during the heating operation, the refrigerant jacket 29 functions as a heat exchanger that cools the cooled elements 103, 142a to 142c, 143a to 143c, and 106 using the refrigerant having a low pressure in the refrigeration cycle after its pressure has been reduced by the expansion valve 26 (that is, the refrigerant flowing between the expansion valve 26 and the outdoor heat exchanger 23).

The liquid-side stop valve 27 and the gas-side stop valve 28 are valves disposed in openings connected to outside devices and pipes (specifically, the liquid refrigerant connection pipe 5 and the gas refrigerant connection pipe 6). The liquid-side stop valve 27 is disposed on the end portion of the liquid refrigerant pipe 35. The gas-side stop valve 28 is disposed on the end portion of the second gas refrigerant pipe 34.

The outdoor unit 2 has an outdoor fan 36 for sucking the outdoor air into the outdoor unit 2, allowing the outdoor air to exchange heat with refrigerant in the outdoor heat exchanger 23, and thereafter expelling the air to the outside. That is, the outdoor unit 2 has the outdoor fan 36 as a fan that supplies to the outdoor heat exchanger 23 the outdoor air which serves as a cooling source or a heating source for the refrigerant flowing through the outdoor heat exchanger 23. Here, for example, a propeller fan driven by an outdoor fan motor 36a is used as the outdoor fan 36.

The outdoor unit 2 has an outdoor-side controller 20 that controls the actions of the parts configuring the outdoor unit 2. Additionally, the outdoor-side controller 20 has a microcomputer and a memory disposed in order to control the outdoor unit 2, and can exchange control signals and so forth with the indoor unit 4 (that is, the indoor-side controller 40). It should be noted that the outdoor-side controller 20 is disposed in the later-described electrical component unit 70.

<Refrigerant Connection Pipes>

The refrigerant connection pipes 5 and 6 are refrigerant pipes installed on site when installing the air condition device 1 in an installation location such as a building, and pipes having a variety of lengths and pipe diameters are used in accordance with installation conditions such as the installation location and the combination of the outdoor unit and the indoor unit.

As described above, the refrigerant circuit 10 of the air conditioning device 1 is configured as a result of the outdoor unit 2, the indoor unit 4, and the refrigerant connection pipes 5 and 6 being connected to each other. The refrigerant circuit 10 is configured as a result of mainly the compressor 21, the outdoor heat exchanger 23 serving as a radiator or an evaporator, the refrigerant jacket 29, the expansion valve 26, and the indoor heat exchanger 41 serving as an evaporator or a radiator being connected to each other. Additionally, the refrigerant circuit 10 is configured to perform the cooling operation serving as a refrigeration cycle operation that causes the refrigerant to circulate in the order of the compressor 21, the outdoor heat exchanger 23 serving as a radiator, the expansion valve 26, and the indoor heat exchanger 41 serving as an evaporator, and when performing this cooling operation the refrigerant circuit 10 is configured to cool the cooled elements 103, 142a to 142c, 143a to 143c, and 106 using the refrigerant having a high pressure in the refrigeration cycle flowing between the outdoor heat exchanger 23 and the expansion valve 26 in the refrigerant jacket 29. Furthermore, the refrigerant circuit 10 is configured to perform the heating operation serving as a refrigeration cycle operation that causes the refrigerant to circulate in the order of the compressor 21, the indoor heat exchanger 41 serving as a radiator, the expansion valve 26, and the outdoor heat exchanger 23 serving as an evaporator, and when performing this heating operation the refrigerant circuit 10 is configured to cool the cooled elements 103, 142a to 142c, 143a to 143c, and 106 using the refrigerant having a low pressure in the refrigeration cycle flowing between the expansion valve 26 and the outdoor heat exchanger 23 in the refrigerant jacket 29.

<Controller>

The air conditioning device 1 can control the devices of the outdoor unit 2 and the indoor unit 4 using a controller 8 configured from the indoor-side controller 40 and the outdoor-side controller 20. That is, a controller 8 that controls the operations of the entire air conditioning device 1 including the refrigeration cycle operations such as the cooling operation and the heating operation described above is configured by the indoor-side controller 40 and the outdoor-side controller 20.

(2) Configuration of Outdoor Unit

Figure 2:
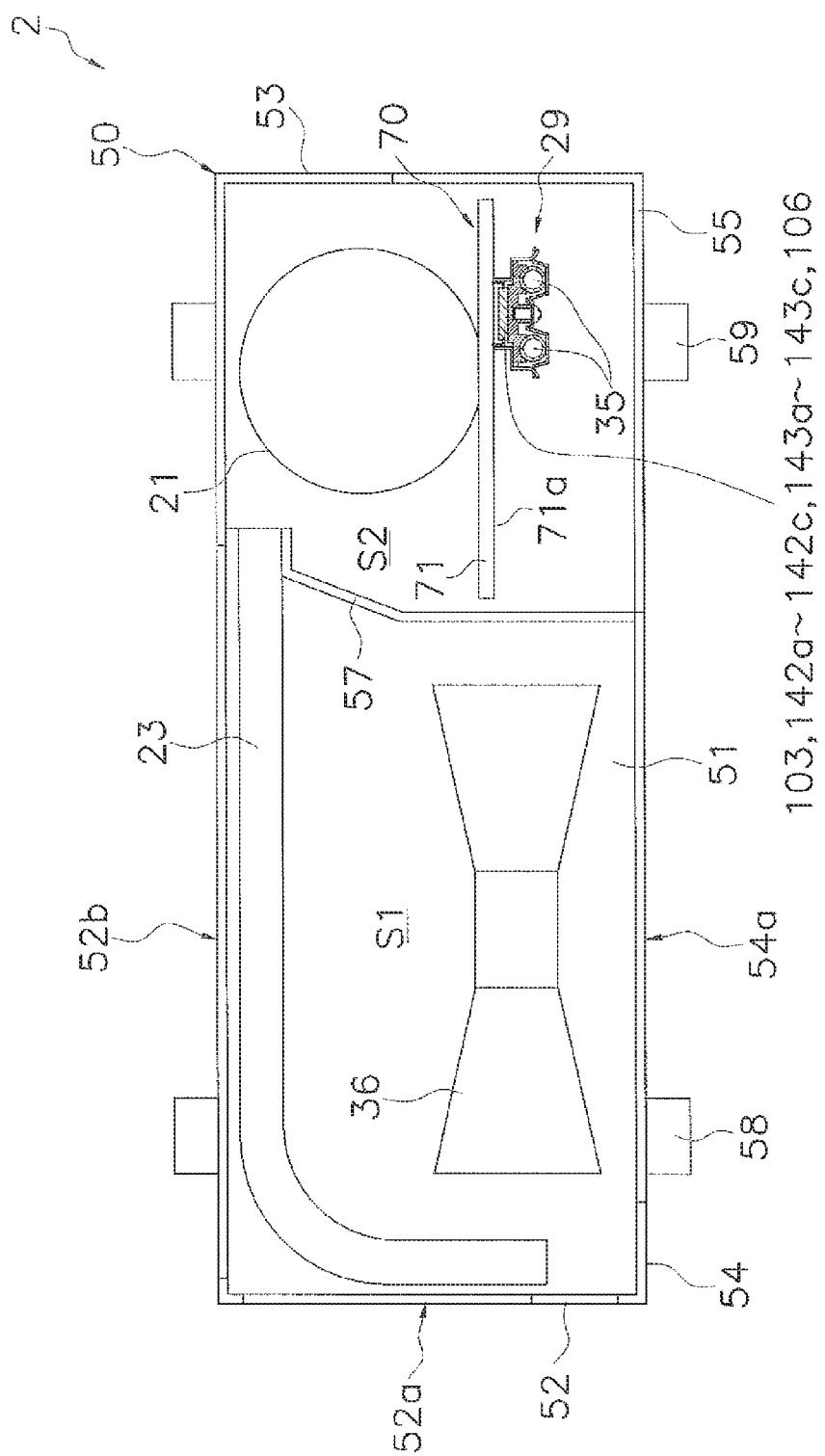
FIG. 2 is a plan sectional view of an outdoor unit.
Figure 3:
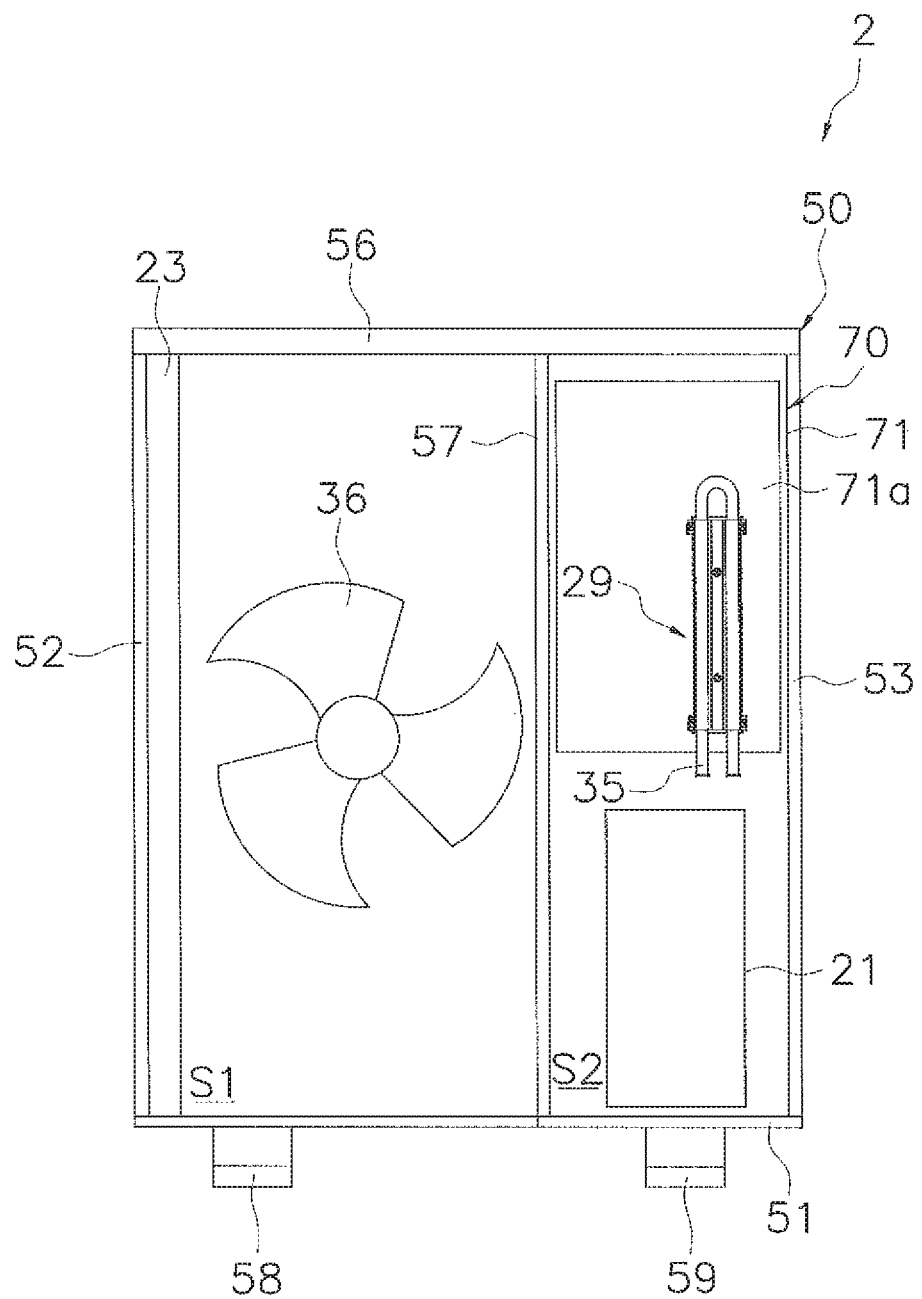
FIG. 3 is a front view showing a state in which a blower compartment-side front panel and a machine compartment-side front panel of the outdoor unit have been detached.

Next, the configuration of the outdoor unit 2 will be described using FIG. 2 and FIG. 3. Here, FIG. 2 is a plan sectional view of the outdoor unit 2. FIG. 3 is a front view showing a state in which a blower compartment-side front panel 54 and a machine compartment-side front panel 55 of the outdoor unit 2 have been detached. It should be noted that in the description below, unless otherwise specified, terms indicating directions and surfaces such as "upper", "lower", "left", "right", "front surface", "side surface", "back surface", "top surface", and "bottom surface" mean directions and surfaces in a case where one faces the front of the outdoor unit 2 shown in FIG. 3.

The outdoor unit 2 has a structure (a so-called trunk structure) in which a blower compartment S1 and a machine compartment S2 are formed as a result of the inside space of a unit casing 50 being divided into left and right spaces by a partition panel 57 that extends in the vertical direction. The outdoor unit 2 is configured to suck outdoor air inside from the back surface and part of a side surface of the unit casing 50 and thereafter expel the air from the front surface of the unit casing 50. The outdoor unit 2 mainly has: the unit casing 50; refrigerant circuit constituent parts including the compressor 21, the four-way switching valve 22, the outdoor heat exchanger 23, the expansion valve 26, the refrigerant jacket 29, the stop valves 27 and 28, and the refrigerant pipes 31 to 35 that interconnect these devices; the outdoor fan 36; and the electrical component unit 70 in which plural electrical components are disposed. It should be noted that although an example where the blower compartment S1 is formed near the left side surface of the unit casing 50 and the machine compartment S2 is formed near the right side surface of the unit casing 50 is described here, the locations of the blower compartment S1 and the machine compartment S2 may also be reversed.

The unit casing 50 is formed in a substantially cuboid shape and houses mainly the refrigerant circuit constituent parts 21 to 28, the outdoor fan 36, and the electrical component unit 70, The unit casing 50 has a bottom panel 51, a blower compartment-side side panel 52, a machine compartment-side side panel 53, a blower compartment-side front panel 54, a machine compartment-side front panel 55, and a top panel 56.

The bottom panel 51 is a panel member that configures the bottom surface section of the unit casing 50. Base legs 58 and 59 that become secured to an on-site installation surface are disposed on the underside of the bottom panel 51.

The blower compartment-side side panel 52 is a panel member that configures the side surface section of the unit casing 50 near the blower compartment S1. The lower portion of the blower compartment-side side panel 52 is secured to the bottom panel S1. An inlet 52a for the outdoor air sucked into the unit casing 50 by the outdoor fan 36 is formed in the blower compartment-side side panel 52.

The machine compartment-side side panel 53 is a panel member that configures part of the side surface section of the unit casing 50 near the machine compartment S2 and the back surface section of the unit casing 50 near the machine compartment S2. The lower portion of the machine compartment-side side panel 53 is secured to the bottom panel 51. An inlet 52b for the outdoor air sucked into the unit casing 50 by the outdoor fan 36 is formed between the end portion of the blower compartment-side side panel 52 on the back surface side and the end portion of the machine compartment-side side panel 53 on the blower compartment S1 side.

The blower compartment-side front panel 54 is a panel member that configures the front surface section of the blower compartment S1 of the unit casing 50. The lower portion of the blower compartment-side front panel 54 is secured to the bottom panel 51, and the end portion of the blower compartment-side front panel 54 on the left side surface side is secured to the end portion of the blower compartment-side side panel 52 on the front surface side. An outlet 54a for blowing to the outside the outdoor air taken inside the unit casing 50 by the outdoor fan 36 is disposed in the blower compartment-side front panel 54.

The machine compartment-side front panel 55 is a panel member that configures part of the front surface section of the machine compartment S2 of the unit casing 50 and part of the side surface section of the machine compartment S2 of the unit casing 50. The end portion of the machine compartment-side front panel 55 on the blower compartment S1 side is secured to the end portion of the blower compartment-side front panel 54 on the machine compartment S2 side, and the end portion of the machine compartment-side front panel 55 on the back surface side is secured to the end portion of the machine compartment-side side panel 53 on the back surface side.

The top panel 56 is a panel member that configures the top surface section of the unit casing 50. The top panel 56 is secured to the blower compartment-side side panel 52, the machine compartment-side side panel 53, and the blower compartment-side front panel 54.

The partition panel 57 is a panel member placed on the bottom panel 51 and extending in the vertical direction. The partition panel 57 divides the inside space of the unit casing 50 into left and right spaces to thereby form the blower compartment S1 near the left side surface and the machine compartment S2 near the right side surface. The lower portion of the partition panel 57 is secured to the bottom panel 51, the end portion of the partition panel 57 on the front surface side is secured to the blower compartment-side front panel 54, and the end portion of the partition panel 57 on the back surface side is secured to the end portion of the outdoor heat exchanger 23 on the machine compartment S2 side.

The outdoor fan 36 is placed inside the blower compartment S1 in a position on the front surface side of the outdoor heat exchanger 23 so as to face the outlet 54a.

The outdoor heat exchanger 23 is a substantially L-shaped heat exchanger panel and is placed inside the blower compartment S1 so as to lie along the left side surface and the back surface of the unit casing 50.

The compressor 21 is a closed compressor having a vertical tube shape and is placed inside the machine compartment S2.

The electrical component unit 70 is placed inside the machine compartment S2 so as to be positioned near the front surface of the unit casing 50. The electrical component unit 70 is a unit in which plural electrical components used to control the devices inside the outdoor unit 2 are disposed, and the outdoor-side controller 20 is disposed in the electrical component unit 70. The electrical component unit 70 mainly has: a printed wiring board 71; and plural electrical components including the outdoor-side controller 20 and cooled elements 103, 142a to 142c, 143a to 143c, and 106 configuring a later-described power supply circuit 100 used to supply power to the compressor motor 21a. The plural electrical components including the outdoor-side controller 20 and the later-described cooled elements 103, 142a to 142c, 143a to 143c, and 106 are mounted on a main surface 71a (here, the surface facing the front surface side of the outdoor unit 2) of the printed wiring board 71.

The refrigerant jacket 29 here is a member having a vertically long shape and lying along the lengthwise direction of a U-shaped bent section of the liquid refrigerant pipe 35, and the refrigerant jacket 29 is supported on the printed wiring board 71. The refrigerant jacket 29 has a structure where the liquid refrigerant pipe 35 bent in a U-shape so as to turn around in the upward and downward direction is attached to it. The refrigerant jacket 29 is placed so as to cover from the front surface side the cooled elements 103, 142a to 142c, 143a to 143c, and 106 mounted on the main surface 71a of the printed wiring board 71, and the refrigerant jacket 29 thermally contacts the cooled elements 103, 142a to 142c, 143a to 143c, and 106.

It should be noted that, although illustration thereof is omitted here, refrigerant circuit constituent parts such as the four-way switching valve 22 and the expansion valve 26 are also placed inside the unit casing 50, Furthermore, the detailed configuration of the electrical component unit 70 including the power supply circuit 100 and the refrigerant jacket 29 will be described later.

(3) Basic Actions of Air Conditioning Device

Next, the basic actions of the air conditioning device 1 will be described using FIG. 1. The air conditioning device 1 can perform, as basic actions, the cooling operation and the heating operation while cooling with the refrigerant jacket 29 the cooled elements 103, 142a to 142c, 143a to 143c, and 106. It should be noted that the cooling operation and the heating operation are performed by the controller 8.

<Cooling Operation>

During the cooling operation, the four-way switching valve 22 is switched to the cooling cycle state (the state indicated by the solid lines in FIG. 1).

In the refrigerant circuit 10, gas refrigerant having a low pressure in the refrigeration cycle is sucked into the compressor 21, compressed to a high pressure in the refrigeration cycle, and thereafter discharged.

The high-pressure gas refrigerant discharged from the compressor 21 travels through the four-way switching valve 22 and is delivered to the outdoor heat exchanger 23.

The high-pressure gas refrigerant delivered to the outdoor heat exchanger 23 exchanges heat with the outdoor air supplied as a cooling source by the outdoor fan 36, radiates heat, and becomes high-pressure liquid refrigerant in the outdoor heat exchanger 23.

The high-pressure liquid refrigerant that has radiated heat in the outdoor heat exchanger 23 is delivered to the refrigerant jacket 29.

The high-pressure liquid refrigerant delivered to the refrigerant jacket 29 exchanges heat with the cooled elements 103, 142a to 142c, 143a to 143c, and 106 and is heated. At this time, the cooled elements 103, 142a to 142c, 143a to 143c, and 106 are cooled in accordance with the flow rate (that is, the refrigerant circulation amount) and the temperature of the high-pressure liquid refrigerant flowing through the refrigerant jacket 29.

The high-pressure liquid refrigerant heated in the refrigerant jacket 29 is delivered to the expansion valve 26.

The high-pressure liquid refrigerant delivered to the expansion valve 26 has its pressure reduced to a low pressure in the refrigeration cycle by the expansion valve 26 and becomes low-pressure refrigerant in a gas-liquid two-phase state. The low-pressure refrigerant in the gas-liquid two-phase state whose pressure has been reduced in the expansion valve 26 travels through the liquid-side stop valve 27 and the liquid refrigerant connection pipe 5 and is delivered to the indoor heat exchanger 41.

The low-pressure refrigerant in the gas-liquid two-phase state delivered to the indoor heat exchanger 41 exchanges heat with the room air supplied as a heating source by the indoor fan 42 and evaporates in the indoor heat exchanger 41. Because of this, the room air is cooled and thereafter supplied to the room so that cooling of the room takes place.

The low-pressure gas refrigerant evaporated in the indoor heat exchanger 41 travels through the gas refrigerant connection pipe 6, the gas-side stop valve 28, and the four-way switching valve 22 and is sucked back into the compressor 21.

<Heating Operation>

During the heating operation, the four-way switching valve 22 is switched to the heating cycle state (the state indicated by the dashed lines in FIG. 1).

In the refrigerant circuit 10, gas refrigerant having a low pressure in the refrigeration cycle is sucked into the component 21, compressed to a high pressure in the refrigeration cycle, and thereafter discharged.

The high-pressure gas refrigerant discharged from the compressor 21 travels through the four-way switching valve 22, the gas-side stop valve 28, and the gas refrigerant connection pipe 6 and is delivered to the indoor heat exchanger 41.

The high-pressure gas refrigerant delivered to the indoor heat exchanger 41 exchanges heat with the room air supplied as a cooling source by the indoor fan 42, radiates heat, and becomes high-pressure liquid refrigerant in the indoor heat exchanger 41. Because of this, the room air is heated and thereafter supplied to the room so that heating of the room takes place.

The high-pressure liquid refrigerant that has radiated heat in the indoor heat exchanger 41 travels through the liquid refrigerant connection pipe 5 and the liquid-side stop valve 27 and is delivered to the expansion valve 26.

The high-pressure liquid refrigerant delivered to the expansion valve 26 has its pressure reduced to a low pressure in the refrigeration cycle by the expansion valve 26 and becomes low-pressure refrigerant in a gas-liquid two-phase state. The low-pressure refrigerant in the gas-liquid two-phase state whose pressure has been reduced in the expansion valve 26 is delivered to the refrigerant jacket 29.

The low-pressure refrigerant in the gas-liquid two-phase state delivered to the refrigerant jacket 29 exchanges heat with the cooled elements 103, 142a to 142c, 143a to 143c, and 106 and is heated. At this time, the cooled elements 103, 142a to 142c, 143a to 143c, and 106 are cooled in accordance with the flow rate (that is, the refrigerant circulation amount) and the temperature of the low-pressure refrigerant in the gas-liquid two-phase state flowing through the refrigerant jacket 29.

The low-pressure refrigerant in the gas-liquid two-phase state heated in the refrigerant jacket 29 is delivered to the outdoor heat exchanger 23.

The low-pressure refrigerant in the gas-liquid two-phase state delivered to the outdoor heat exchanger 23 exchanges heat with the outdoor air supplied as a heating source by the outdoor fan 36, evaporates, and becomes low-pressure gas refrigerant in the outdoor heat exchanger 23.

The low-pressure refrigerant evaporated in the outdoor heat exchanger 23 travels through the four-way switching valve 22 and is sucked back into the compressor 21.

Figure 4:
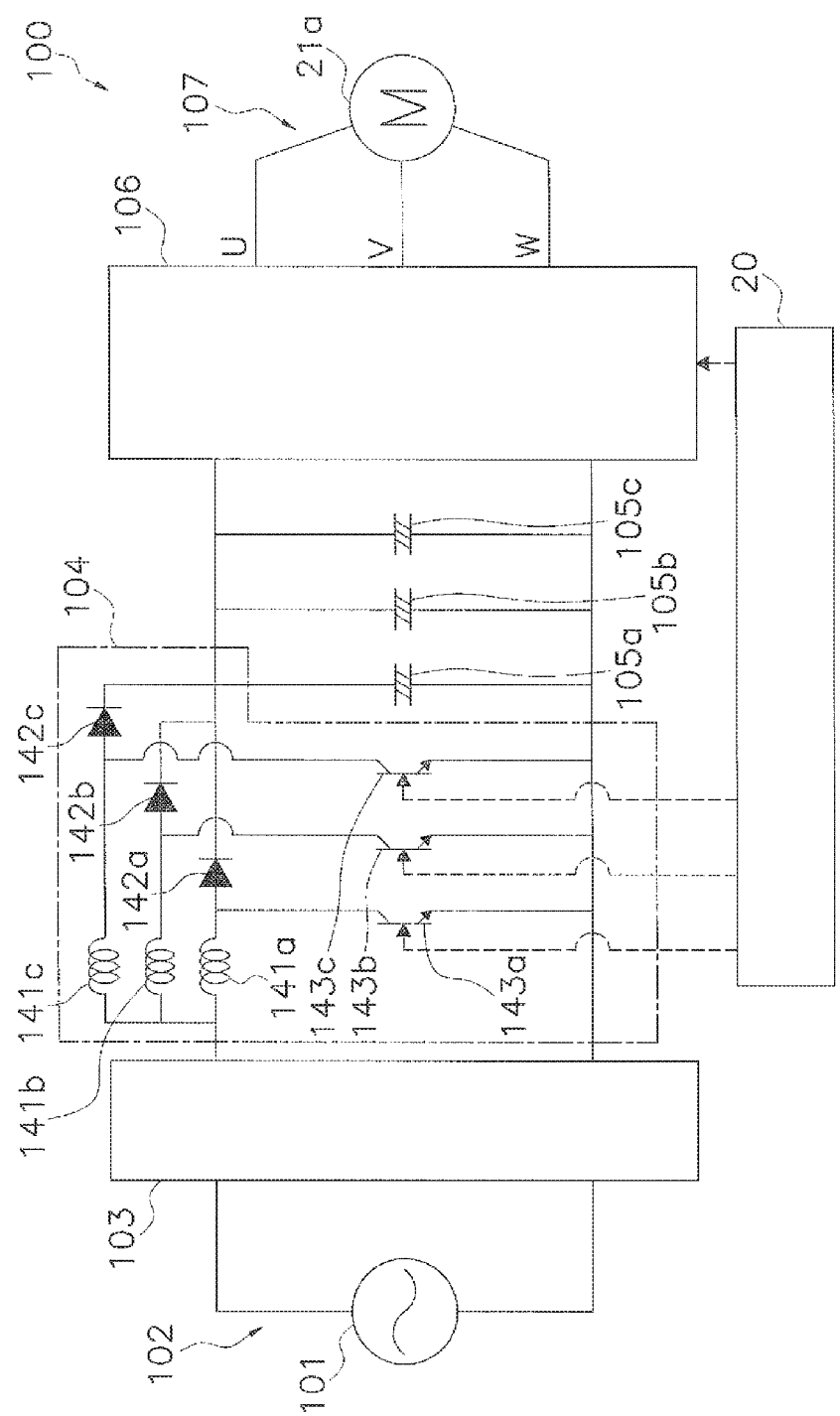
FIG. 4 is a schematic configuration diagram of a power supply circuit.
Figure 5:
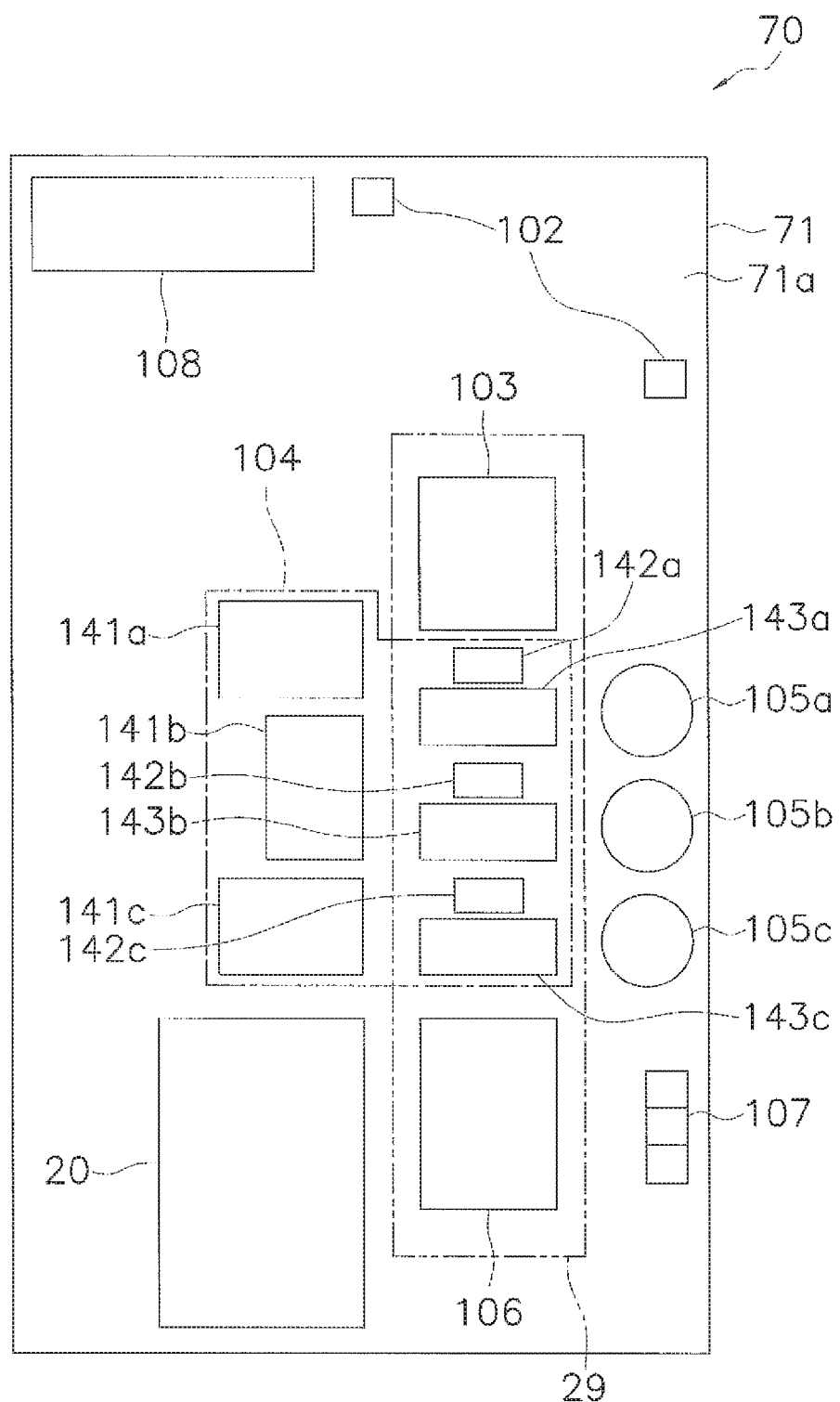
FIG. 5 is a front view of a printed wiring board.
Figure 6:
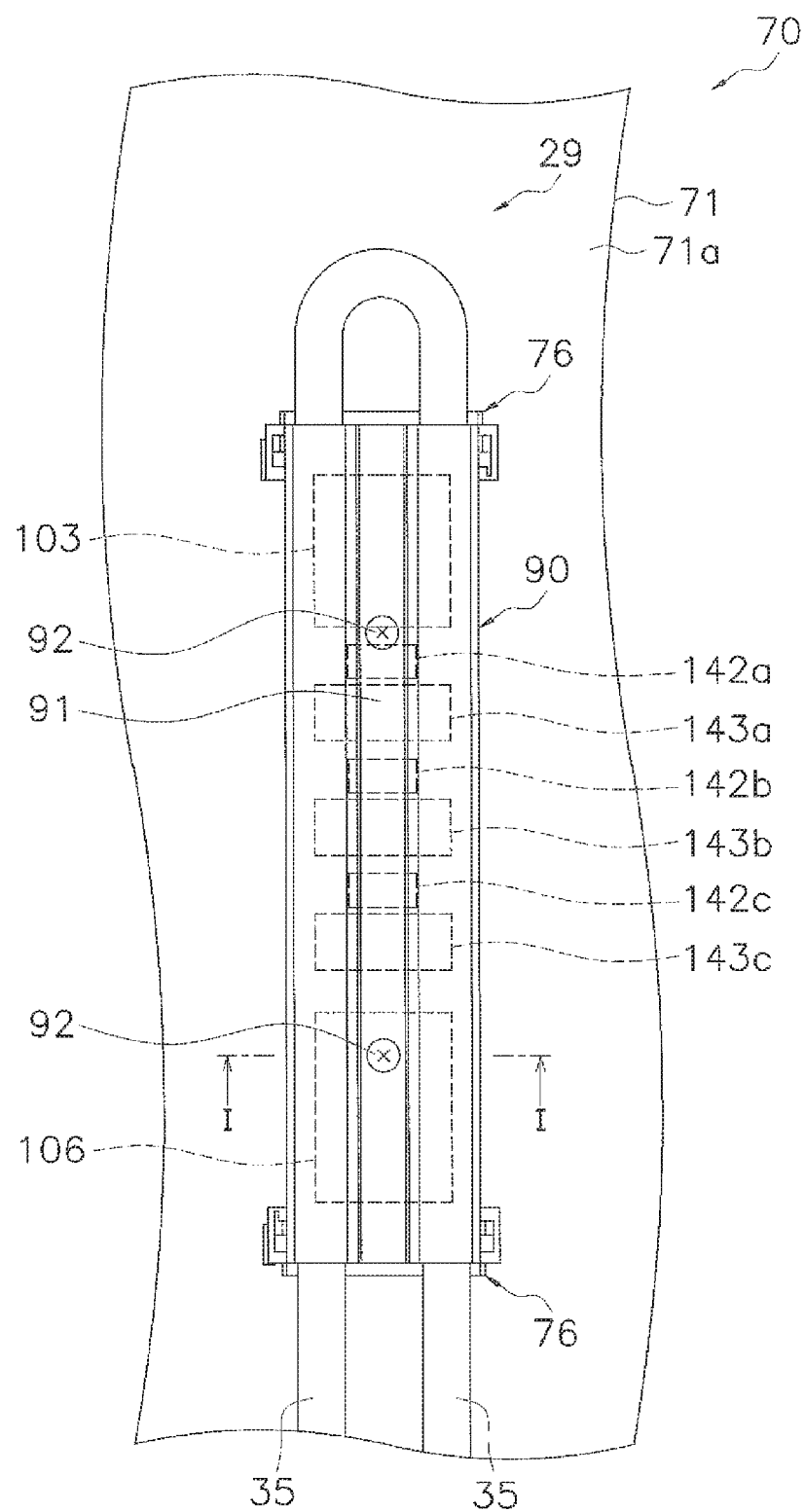
FIG. 6 is a front view of a refrigerant jacket.
Figure 7:
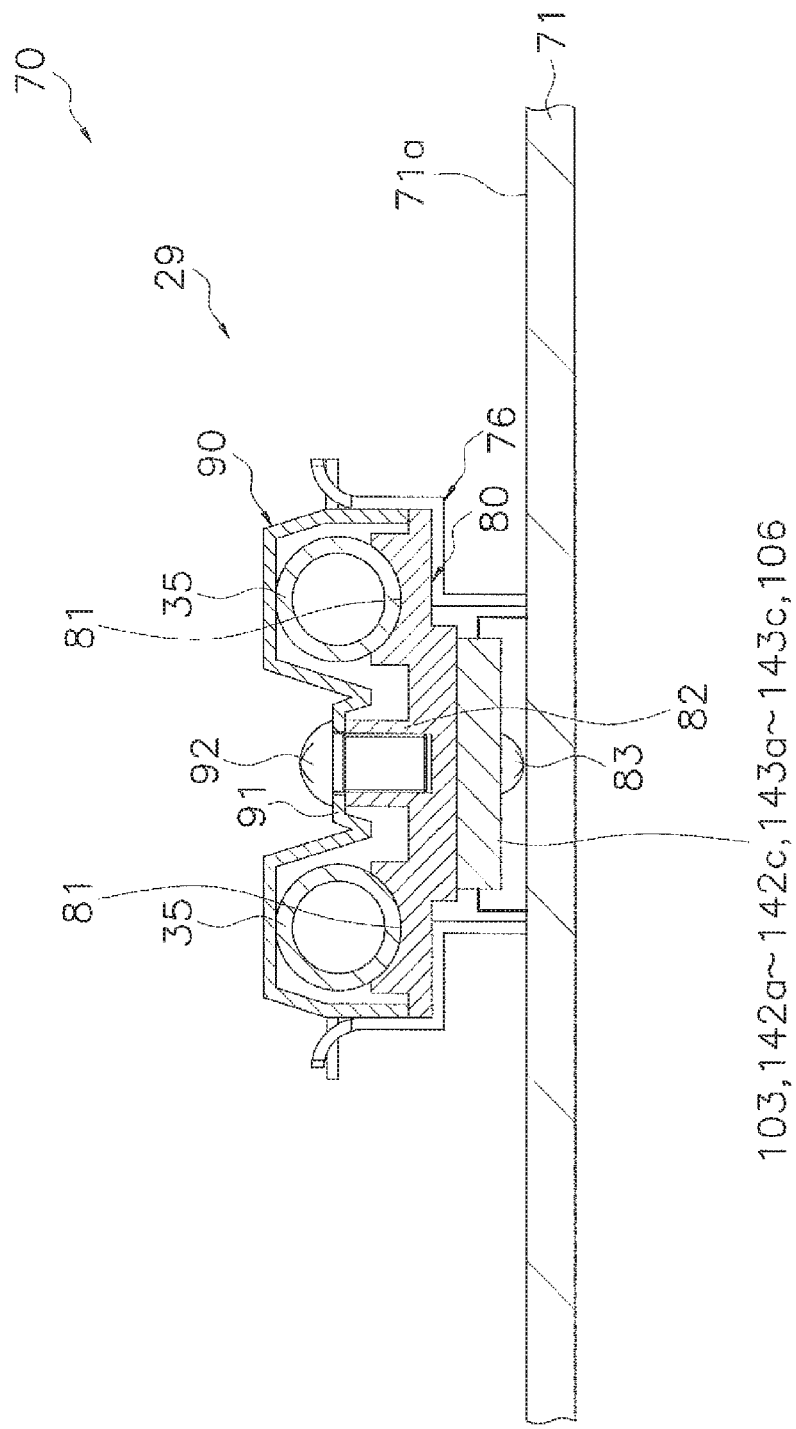
FIG. 7 is a sectional view along line I-I of FIG. 6.

(4) Configuration of Electrical Component Unit including Power Supply Circuit and Refrigerant Jacket Next, the configuration of the electrical component unit 70 including the power supply circuit 100 and the refrigerant jacket 29 will be described using FIG. 2 to FIG. 7. Here, FIG. 4 is a schematic configuration diagram of the power supply circuit 100. FIG. 5 is a front view of the printed wiring board 71. FIG. 6 is a front view of the refrigerant jacket 29. FIG. 7 is a sectional view along line I-I of FIG. 6.

As described above, the electrical component unit 70 mainly has: the printed wiring board 71; and the plural electrical components including the outdoor-side controller 20 and the cooled elements 103, 142a to 142c, 143a to 143c, and 106 configuring the power supply circuit 100 used to supply power to the compressor motor 21a. Additionally, the plural electrical components including the outdoor-side controller 20 and the cooled elements 103, 142a to 142c, 143a to 143c, and 106 are mounted on the main surface 71a (here, the surface facing the front surface side of the outdoor unit 2) of the printed wiring board 71.

First, the configurations of the printed wiring board 71 and the mounted plural electrical components will be described in detail. The printed wiring board 71 has the main surface (front surface) 71a that faces the open side that appears by detaching part (here, the machine compartment-side front panel 55) of the unit casing 50, and the plural electrical components are mounted on this main surface 71a. The printed wiring board 71 is placed inside the machine compartment S2 in an orientation parallel to the upward and downward direction. It should be noted that the printed wiring board 71 is not limited to being placed in an orientation strictly parallel to the upward and downward direction and may also be placed in an orientation somewhat sloping with respect to the upward and downward direction.

The plural electrical components include a high-voltage electrical parts group and a low-voltage electrical parts group. Included in the high-voltage electrical parts group are plural electrical components of a motive power system for performing motive power control and electrical power conversion. Specifically, included in the high-voltage electrical parts group are electrical components configuring the power supply circuit 100 used to supply power to the compressor motor 21a. Included in the low-voltage electrical parts group are plural electrical components of a communication system and a signal system such as operation elements like switches and connectors and indicator elements like LEDs. Specifically, included in the low-voltage electrical parts group are service switches 108, for performing various types of settings, and the outdoor-side controller 20, comprising a microcomputer and a memory disposed in order to control the outdoor unit 20.

The power supply circuit 100 is an electrical circuit used to supply power to the compressor motor 21a. It should be noted that, here, as the power supply circuit 100, a configuration where a power supply circuit for the compressor motor 21a is mounted on the printed wiring board 71 will be described. It should be noted that, although it is not shown in the drawings here, the outdoor unit 2 also has a power supply circuit used to supply power to the outdoor fan motor 36a. However, the configuration thereof is the same as that of the power supply circuit 100 for the compressor motor 21a described below, so description here will be omitted. In a case where the power supply circuit for the outdoor fan motor 36a is mounted on the printed wiring board 71, it is preferred that the electrical components configuring the power supply circuit be mounted on the main surface 71a of the printed wiring board 71 like the electrical components configuring the power supply circuit 100 for the compressor motor 21a.

The power supply circuit 100 mainly has input line components 102, a rectifier circuit 103, a power factor improvement circuit 104, smoothing capacitors 105a to 105c, an inverter circuit 106, and output line components 107.

The input line components 102 are terminal components to which single-phase alternating current power is input from a power supply 101 such as a commercial power supply.

The rectifier circuit 103 is connected to the input line components 102, and is a circuit component that rectifies to a direct-current voltage the alternating-current voltage that has been input through the input line components 102. The rectifier circuit 103 mainly has a diode bridge or the like that emits a lot of heat, and the rectifier circuit 103 configures a cooled element that requires cooling.

The power factor improvement circuit 104 is connected between the rectifier circuit 103 and the smoothing capacitors 105a to 105c, and is a circuit for improving the power factor of the power supply circuit 100, that is, the effective electrical power that is actually used by a load (here, the compressor motor 21a) among the electrical power that is input from the power supply 101. The power factor improvement circuit 104 mainly has plural (here, three) 141a to 141c connected to each other in parallel and diodes 142a to 142c and switching elements 143a to 143c connected to each of the reactors 141a to 141c. The plural reactors 141a to 141c are each connected to a circuit component branching into a plurality (here, three) from the output end of the rectifier circuit 103. The diodes 142a to 142c are each connected in series to the corresponding reactors 141a to 141c. The switching elements 143a to 143c comprise gate bipolar transistors, for example, and are each connected to a circuit component branching from between the corresponding reactors 141a to 141c and the corresponding diodes 142a to 142c. The power factor improvement circuit 104 has the diodes 142a to 142c and the switching elements 143a to 143c that emit a lot of heat, and these configure cooled elements that require cooling. It should be noted that although the power factor improvement circuit 104 here has a configuration having three reactor, diode, and switching element sets, the power factor improvement circuit 104 is not limited to this and may also have a configuration having two reactor, diode, and switching element sets or a configuration having four or more reactor, diode, and switching element sets.

The smoothing capacitors 105a to 105c are connected between the power factor improvement circuit 104 and the inverter circuit 106, and are elements that smooth the direct-current voltages that are input via the power factor improvement circuit 104. It should be noted that although there are three smoothing capacitors 105a to 105c here, the number of the smoothing capacitors is not limited to this and may also be two or less or four or more.

The inverter circuit 106 is connected between the smoothing capacitors 105a to 105c and the output line components 107, and is a circuit component that converts the direct-current voltages smoothed by the smoothing capacitors 105a to 105c to desired three-phase drive currents. The inverter circuit 106 has switching elements such as gate bipolar transistors, for example, and configures a cooled element that requires cooling.

The output line components 107 are terminal components for outputting to the compressor motor 21a the drive currents that have been output from the inverter circuit 106.

Additionally, the power supply circuit 100 is configured in such a way that the switching elements and so forth configuring the power factor improvement circuit 104 and the inverter circuit 106 are controlled and the drive currents output to the compressor motor 21a are adjusted by the outdoor-side controller 20.

In this way, here, the power supply circuit 100 configures an interleaved power supply circuit having the power factor improvement circuit 104. Additionally, the power factor improvement circuit 104 has: the plural (here, three) reactors 141a to 141c; and the diodes 142a to 142c and the switching elements 143a to 143c serving as cooled elements connected to each of the reactors 141a to 141c. Furthermore, the power supply circuit 100 also has the rectifier circuit 103 and the inverter circuit 106 as cooled elements.

Next, the placement of the plural electrical components mounted on the printed wiring board 71 will be described in detail. The high-voltage electrical parts group is placed roughly in a region near the right portion of the main surface 71a of the printed wiring board 71, and the low-voltage electrical parts group is placed roughly in a region near the left portion of the main surface 71a of the printed wiring board 71. In this way, by separating and placing the high-voltage electrical parts group and the low-voltage electrical parts group, it becomes difficult for the low-voltage electrical parts to be adversely affected by the high-voltage electrical parts. It should be noted that, although here the low-voltage electrical parts group is placed roughly in a region near the left portion and the high-voltage electrical parts group is roughly placed in a region near the right portion, the placement of the low-voltage electrical parts group and the high-voltage electrical parts group is not limited to this; for example, the placement of the low-voltage electrical parts group and the high-voltage electrical parts group may also be reversed, and the main surface 71a may also be divided another way such as being divided into upper and lower regions.

Regarding the electrical components configuring the low-voltage electrical parts group here, the outdoor-side controller 20 is placed on the lower portion of the printed wiring board 71 near the left side, and the service switches 108 are placed on the upper portion of the printed wiring board 71 near the left side. It should be noted that because the service switches 108 are placed on the upper edge portion, workability at the time of servicing is excellent.

Regarding the electrical components configuring the high-voltage electrical parts group, the input line components 102 are placed on the upper portion of the printed wiring board 71 near the right side.

The rectifier circuit 103 is placed on the upper portion of the printed wiring board 71 near the right side. Here, the rectifier circuit 103 is placed in a position roughly on the lower side of the input line components 102.

The power factor improvement circuit 104 is placed in the vicinity of the upward and downward direction and rightward and leftward direction central portion of the printed wiring board 71. Here, the power factor improvement circuit 104 is placed in a position roughly on the lower side of the rectifier circuit 103. Additionally, the diodes 142a to 142c and the switching elements 143a to 143c configuring the power factor improvement circuit 104 are placed in a position directly under the rectifier circuit 103, and the reactors 141a to 141c are placed in a position directly on the left side of the diodes 142a to 142c and the switching elements 143a to 143c. In this way, here, the reactors 141a to 141c are also mounted together with the other high-voltage electrical parts on the main surface 71a of the printed wiring board 71. Furthermore, the diodes 142a to 142c are placed sequentially lined up in the upward and downward direction, and the corresponding switching elements 143a to 143c are placed in positions directly on the lower sides of each of the diodes 142a to 142c. Moreover, the reactors 141a to 141c are also each placed in positions roughly on the left side of the sets of the corresponding diodes 142a to 142c and switching elements 143a to 143c. Because of this, the reactors 41a to 141c are placed in the neighborhood of the diodes 142a to 142c and the switching elements 143a to 143c configuring the power factor improvement circuit 104.

The smoothing capacitors 105a to 105c are placed in the vicinity of the upward and downward direction central portion of the printed wiring board 71 near the right side. The smoothing capacitors 105a to 105c are placed in positions directly on the right side of the power factor improvement circuit 104. Here, the smoothing capacitors 105a to 105c are placed lined up in the upward and downward direction. Because of this, here, the reactors 141a to 141c are placed on the opposite side of the smoothing capacitors 105a to 105c, with the diodes 142a to 142c and the switching elements 143a to 143c configuring the power factor improvement circuit 104 being sandwiched in between. That is, the reactors 141a to 141c configuring the power factor improvement circuit 104, the diodes 142a to 142c and the switching elements 143a to 143c configuring the power factor improvement circuit 104, and the smoothing capacitors 105a to 105c are placed in the order of the power supply path.

The inverter circuit 106 is placed on the lower portion of the printed wiring board 71 near the right side. The inverter circuit 106 is placed in a position roughly on the lower side of the power factor improvement circuit 104, and more specifically is placed in a position directly on the lower side of the diodes 142a to 142c and the switching elements 143a to 143c (here, the switching element 143c placed in a position on the lowermost side). Because of this, here, the rectifier circuit 103 that is a cooled element configuring the power supply circuit 100, the diodes 142a to 142c and the switching elements 143a to 143c of the power factor improvement circuit 104, and the inverter circuit 106 are lined up in one row sequentially along one direction (here, the upward and downward direction) on the main surface 71a of the printed wiring board 71. That is, the cooled elements 103, 142a to 142c, 143a to 143c, and 106 configuring the power supply circuit 100 are placed on the main surface 71a of the printed wiring board 71 in an order conforming to the power supply path of the power supply circuit 100. Moreover, here, because the input line components 102 are placed in positions roughly on the upper side of the rectifier circuit 103, the input line components 102 are also placed on the main surface 71a of the printed wiring board 71 in an order conforming to the power supply path of the power supply circuit 100.

The output line components 107 are placed in the vicinity of the lower portion of the printed wiring board 71 near the right side. Here, the output line components 107 are placed in a position directly on the right side of the inverter circuit 106.

Next, the configuration of the refrigerant jacket 29 that cools the cooled elements 103, 142a to 142c, 143a to 143c, and 106 mounted on the main surface 71a of the printed wiring board 71 will be described in detail. The refrigerant jacket 29 mainly has a refrigerant cooling member 80 and a cover member 90.

The refrigerant cooling member 80 is a member made of metal, and having a vertically long shape, in which are formed groove portions 81 into which a refrigerant pipe (here, the liquid refrigerant pipe 35) configuring the refrigerant circuit 10 fits and which thermally contacts the cooled elements 103, 142*a* to 142*c*, 143*a* to 143*c*, and 106. The refrigerant cooling member 80 is placed in such a way that its back surface contacts the front surface sides of the cooled elements 103, 142*a* to 142*c*, 143*a* to 143*c*, and 106 mounted on the printed wiring board 71. That is, here, the refrigerant jacket 29 including the refrigerant cooling member 80 is placed between the reactors 141*a* to 141*c* and the smoothing capacitors 105*a* to 105*c* in the rightward and leftward direction. The refrigerant cooling member 80 is supported on the printed wiring board 71 via support members 76. Here, the support members 76 are members secured to the upper end and the lower end of the refrigerant cooling member 80 as a result of being fitted together therewith or fastened with screws thereto, for example. It should be noted that the support members 76 may also be formed integrally with the refrigerant cooling member 80. A pair of the groove portions 81 are formed in the front surface of the refrigerant cooling member 80. The pair of groove portions 81 extend in the upward and downward direction along the straight pipe portions of the liquid refrigerant pipe 35. The cross sections of the groove portions 81 are formed in substantially circular arc shapes, and parts of the outer peripheral surface of the liquid refrigerant pipe 35 fit into the groove portions 81. Grease for promoting heat conduction is applied between the liquid refrigerant pipe 35 and the groove portions 81. A middle portion 82 that extends in the upward and downward direction roughly parallel to the groove portions 81 is formed between the pair of groove portions 81 in the rightward and leftward direction. Additionally, the cooled elements 103, 142*a* to 142*c*, 143*a* to 143*c*, and 106 are fastened with screws and secured to the back surface of the refrigerant cooling member 80 using element securing screws 83. It should be noted that the method of securing the cooled elements 103, 142*a* to 142*c*, 143*a* to 143*c*, and 106 to the refrigerant cooling member 80 is not limited to fastening with screws; furthermore, because it suffices for the cooled elements 103, 142*a* to 142*c*, 143*a* to 143*c*, and 106 and the refrigerant cooling member 80 to thermally contact each other, the cooled elements 103, 142*a* to 142*c*, 143*a* to 143*c*, and 106 do not necessarily have to be secured to the refrigerant cooling member 80.

The cover member 90 is a member made of metal, and having a vertically long shape, that covers the refrigerant cooling member 80 in a state in which the refrigerant pipe (here, the liquid refrigerant pipe 35) is fitted into the groove portions 81. The cover member 90 is placed opposing the refrigerant cooling member 80. The cover member 90 straddles the pair of groove portions 81 of the refrigerant cooling member 80. An attachment portion 91 that opposes the middle portion 82 of the refrigerant cooling member 80 is formed in the rightward and leftward direction central section of the cover member 90. The cover member 90 covers the refrigerant cooling member 80 in a state in which the liquid refrigerant pipe 35 is fitted into the groove portions 81, and the cover member 90 is fastened with screws and secured, at the position of the attachment portion 91, to the middle portion 82 of the refrigerant cooling member 80 using plural (here, two) cover securing screws 92. It should be noted that the number of the cover securing screws 92 is not limited to two and may also be one or three or more. Furthermore, the position at which the cover member 90 is fastened with screws and secured to the refrigerant cooling member 80 is also not limited to the rightward and leftward direction central section. Moreover, the method of securing the cover member 90 to the refrigerant cooling member 80 is also not limited to fastening with screws.

The cooled elements 103, 142*a* to 142*c*, 143*a* to 143*c*, and 106 placed and mounted lined up in the upward and downward direction on the main surface 71*a* of the printed wiring board 71 are cooled by the refrigerant jacket 29 having the configuration described above.

(5) Characteristics of Air Conditioning Device

The air conditioning device 1 of the present embodiment has the following characteristics.

<A>

Here, as described above, in contrast to the conventional configuration that uses a refrigerant jacket to cool the cooled elements, the reactors 141*a* to 141*c* are mounted together with the other high-voltage electrical parts on the one main surface 71*a* of the printed wiring board 71. For this reason, harnesses for connecting the reactors 141*a* to 141*c* can be eliminated.

Because of this, here, the wiring pattern on the printed wiring board 71 can be kept from becoming complicated and interference noise can be reduced. Additionally, this also contributes to a reduction in the size and a decrease in the cost of the printed wiring board 71, and a high-performance placement of parts on the printed wiring board 71 can be realized.

<B>

Here, as described above, an interleaved power supply circuit is employed as the power supply circuit 100. The interleaved power supply circuit 100 has the rectifier circuit 103, the power factor improvement circuit 104, and the inverter circuit 106, and these circuits 103, 104, and 106 are connected in the order of the power supply path, which is the rectifier circuit 103, the power factor improvement circuit 104, and the inverter circuit 106. Included in these circuits 103, 104, and 106 are the cooled elements, such as diodes and switching elements.

Additionally, here, as described above, the cooled elements included in these circuits 103, 104, and 106 are placed in an order conforming to the power supply path, that is, in the order of the rectifier circuit 103, the cooled elements (the diodes 142*a* to 142*c* and the switching elements 143*a* to 143*c*) configuring the power factor improvement circuit 104, and the inverter circuit 106.

Because of this, here, the wiring pattern on the printed wiring board 71 can be kept from becoming complicated even in the case of employing the interleaved power supply circuit 100 in which the number of parts is large. Specifically, the cooled elements 103, 142*a* to 142*c*, 143*a* to 143*c*, and 106 are lined up together in the upward and downward direction, so the wiring pattern connecting the rectifier circuit 103, the power factor improvement circuit 104, and the inverter circuit 106 can be disposed in as short a distance as possible in conformity with the order of the power supply path. Furthermore, here, the input line components 102 are placed directly on the upper side of the rectifier circuit 103, so including also the wiring pattern from the input line components 102 to the rectifier circuit 103, the wiring pattern can be disposed in as short a distance as possible in conformity with the power supply path. Moreover, here, the output line components 107 are placed directly on the right side of the inverter circuit 106, so including also the wiring pattern from the inverter circuit 106 to the output line components 107, the wiring pattern can be disposed in as short a distance as possible in conformity with the power supply path. Additionally, this also contributes to a reduction in the size of the printed wiring board 71.

<C>

Furthermore, in the interleaved power supply circuit 100, the smoothing capacitors 105a to 105c are connected between the power factor improvement circuit 104 and the inverter circuit 106, and the power factor improvement circuit 104 has a configuration where the diodes 142a to 142c and the switching elements 143a to 143c are connected to each of the plural reactors 141a to 141c. These parts including the smoothing capacitors 105a to 105c are connected in the order of the power supply path, which is the reactors 141a to 141c, the diodes 142a to 142c and the switching elements 143a to 143c, and the smoothing capacitors 105a to 105c.

Additionally, here, as described above, the reactors 141a to 141c are placed on the opposite side of the smoothing capacitors 105a to 105c, with the diodes 142a to 142c and the switching elements 143a to 143c being sandwiched in between. Here, the diodes 142a to 142c and the switching elements 143a to 143c are placed on the right side of the reactors 141a to 141c, and the smoothing capacitors 105a to 105c are placed further on the right side. That is, the reactors 141a to 141c configuring the power factor improvement circuit 104, the diodes 142a to 142c and the switching elements 143a to 143c configuring the power factor improvement circuit 104, and the smoothing capacitors 105a to 105c are placed in the order of the power supply path.

Furthermore, here, as described above, in addition to the reactors 141a to 141c being placed on the opposite side of the smoothing capacitors 105a to 105c, with the diodes 142a to 142c and the switching elements 143a to 143c being sandwiched in between, the reactors 141a to 141c are placed in the neighborhood of the diodes 142a to 142c and the switching elements 143a to 143c configuring the power factor improvement circuit 104. Specifically, the reactors 141a to 141c are placed directly on the left side of the diodes 142a to 142c and the switching elements 143a to 143c.

Because of this, here, the wiring pattern on the printed wiring board 71 can be further kept from becoming complicated in the case of employing the interleaved power supply circuit 100 in which the number of parts is large. Specifically, the reactors 141a to 141c configuring the power factor improvement circuit 104, the diodes 142a to 142c and the switching elements 143a to 143c configuring the power factor improvement circuit 104, and the smoothing capacitors 105a to 105c are lined up together in the rightward and leftward direction, so the wiring pattern connecting the power factor improvement circuit 104 and the smoothing capacitors 105a to 105c can be disposed in as short a distance as possible in conformity with the order of the power supply path. Additionally, this also contributes to a further reduction in the size of the printed wiring board 71.

<D>

In particular, here, as described above, large parts such as the refrigerant jacket 29 are attached to the printed wiring board, no it is necessary to place the cooled elements 103, 142a to 142c, 143a to 143c, and 106 concentrated in the position of the refrigerant jacket 29, and the constraints on the placement of the wiring pattern connecting the high-voltage electrical parts are extremely large.

However, by devising the placement of the high-voltage electrical parts group including the placement of the reactors 141a to 141c such as described in <A>to <C>above, the wiring pattern on the printed wiring board 71 can be kept from becoming complicated and interference noise can be reduced while sufficiently obtaining the effect of cooling with the refrigerant jacket 29 the cooled elements 103, 142a to 142c, 143a to 143c, and 106.

<E>

Furthermore, here, as described above, the output line components 107 are placed in a position away in the upward and downward direction from the input line components 102. By separating the input line components 102 and the output line components 107 in this way, the effect of reducing interference noise can be enhanced. Furthermore, here, the input line components 102 are placed in the vicinity of the upper end portion of the printed wiring board 71, and the output line components 107 are placed in the vicinity of the lower end portion of the printed wiring board 71. Because of this, the work efficiency of, for example, work for connecting other wires to the input line components 102 and the output line components 107 in a manufacturing line is improved.

(6) Example Modifications

<A>

In the above-described embodiment, a type of air conditioning device 1 configured by interconnecting the outdoor unit 2 and the indoor unit 4 was taken as an example and described as the refrigeration device, but the invention is not limited to this and may also be another type of refrigeration device.

<B>

In the above-described embodiment, a case where the main surface 71a of the printed wiring board 71 faces the front surface side of the outdoor unit 2 was taken as an example and described, but the invention is not limited to this, and the main surface 71a of the printed wiring board 71 may also face another direction, such as the right or left surface side or the upper surface side, in accordance with the structure of the electrical component unit 70 and the placement of the electrical component unit 70 inside the outdoor unit 2.

<C>

In the above-described embodiment, the reactors 141a to 141c are placed on the left side of the refrigerant jacket 29 and the smoothing capacitors 105a to 105c are placed on the right side of the refrigerant jacket 29, but the invention is not limited to this, and the reactors 141a to 141c may also be placed on the right side of the refrigerant jacket 29 and the smoothing capacitors 105a to 105c may also be placed on the left side of the refrigerant jacket 29.

<D>

In the above-described embodiment, the interleaved power supply circuit 100 was taken as an example and described as the power circuit, but the invention is not limited to this and is applicable to a variety of power circuits, such as other DC-DC converter circuits equipped with a high-voltage electrical parts group including reactors and cooled elements that require cooling.

<E>

The refrigerant jacket 29 of the above-described embodiment has a vertically long shape inside the outdoor unit 2, but the refrigerant jacket 29 is not limited to this and may also have a horizontally long shape.

<F>

The refrigerant jacket 29 of the above-described embodiment uses the refrigerant flowing through the liquid refrigerant pipe 35 to cool the cooled elements 103, 142a to 142c, 143a to 143c, and 106, but the refrigerant jacket 29 is not limited to this and may also use the refrigerant flowing through another refrigerant pipe of the refrigerant circuit 10 to cool the cooled elements 103, 142a to 142c, 143a to 143c, and 106.

INDUSTRIAL APPLICABILITY

The present invention is widely applicable to refrigeration devices equipped with a refrigerant jacket that uses refrigerant flowing through a refrigerant circuit to cool cooled elements.

What is claimed is:

1. A refrigeration device having a refrigerant circuit, the refrigeration device comprising:
    a high-voltage electrical parts group including a plurality of reactors and cooled elements;
    a low-voltage electrical parts group;
    a printed wiring board; and
    a refrigerant jacket that uses refrigerant flowing through the refrigerant circuit to cool the cooled elements,
    the high-voltage electrical parts group including the reactors and the low-voltage electrical parts group are mounted on one main surface of the printed wiring board,
    the high-voltage electrical parts group forming an interleaved power supply circuit,
    the cooled elements of the power supply circuit being placed in an order conforming to a power supply path of the power supply circuit,
    the power supply circuit having a rectifier circuit, a power factor improvement circuit, smoothing capacitors, and an inverter circuit,
    the power factor improvement circuit having the plurality of reactors connected to each other in parallel and diodes and switching elements serving as the cooled elements connect to each of the reactors, and
    the reactors being placed on an opposite side of the smoothing capacitors, with the diodes and the switching elements forming the power factor improvement circuit being sandwiched in between.

2. The refrigeration device according to claim 1, wherein the reactors are placed adjacent to the diodes and the switching elements forming the power factor improvement circuit.

* * * * *